United States Patent
Ke et al.

(10) Patent No.: US 11,033,930 B2
(45) Date of Patent: Jun. 15, 2021

(54) METHODS AND APPARATUS FOR CRYOGENIC GAS STREAM ASSISTED SAM-BASED SELECTIVE DEPOSITION

(71) Applicant: Applied Materials, Inc., Santa Clara, CA (US)

(72) Inventors: Chang Ke, Sunnyvale, CA (US); Song-Moon Suh, San Jose, CA (US); Liqi Wu, San Jose, CA (US); Michael S. Jackson, Sunnyvale, CA (US); Lei Zhou, San Jose, CA (US); Biao Liu, San Jose, CA (US); Cheng Pan, San Jose, CA (US); Paul F. Ma, Santa Clara, CA (US); Mei Chang, Saratoga, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/242,184

(22) Filed: Jan. 8, 2019

(65) Prior Publication Data
US 2019/0210061 A1 Jul. 11, 2019

Related U.S. Application Data

(60) Provisional application No. 62/614,876, filed on Jan. 8, 2018.

(51) Int. Cl.
*B05D 3/04* (2006.01)
*B05D 1/00* (2006.01)
(Continued)

(52) U.S. Cl.
CPC ............... *B05D 3/044* (2013.01); *B05D 1/60* (2013.01); *B05D 3/0453* (2013.01); *C23C 16/04* (2013.01); *C23C 16/042* (2013.01);
*C23C 16/45527* (2013.01); *C23C 16/45544* (2013.01); *C23C 16/45563* (2013.01); *H01L 21/0228* (2013.01); *H01L 21/02057* (2013.01); *H01L 21/02164* (2013.01); *H01L 21/02175* (2013.01); *H01L 21/02304* (2013.01); *H01L 21/02312* (2013.01);
(Continued)

(58) Field of Classification Search
CPC ......... B05D 3/044; B05D 1/60; B05D 3/0453
See application file for complete search history.

(56) References Cited

U.S. PATENT DOCUMENTS 4,871,651 A 10/1989 Robert et al.
5,062,898 A 11/1991 McDermott et al.
(Continued)

OTHER PUBLICATIONS

Oviroh, Peter Ozaveshe, et al., "New development of atomix layer deposition: processes,methods and applications", Science and Technology of Advanced Materials, vol. 20, No. 1, 2019, 465-496.

*Primary Examiner* — Dah-Wei D. Yuan
*Assistant Examiner* — Kristen A Dagenais-Englehart
(74) *Attorney, Agent, or Firm* — Servilla Whitney LLC

(57) ABSTRACT

Methods and apparatus for removing deposits in self-assembled monolayer (SAM) based selective deposition process schemes using cryogenic gas streams are described. Some methods include removing deposits in self-assembled monolayer (SAM) based selective depositions by exposing the substrate to cryogenic aerosols to remove undesired deposition on SAM protected surfaces. Processing chambers for cryogenic gas assisted selective deposition are also described.

11 Claims, 5 Drawing Sheets

(51) Int. Cl.

| | |
|---|---|
| *C23C 16/455* | (2006.01) |
| *C23C 16/04* | (2006.01) |
| *H01L 21/02* | (2006.01) |
| *H01L 21/3105* | (2006.01) |
| *H01L 21/321* | (2006.01) |
| *B05D 1/18* | (2006.01) |

(52) U.S. Cl.
CPC ........ *H01L 21/3105* (2013.01); *H01L 21/321* (2013.01); *B05D 1/185* (2013.01); *B05D 3/048* (2013.01)

(56) References Cited

U.S. PATENT DOCUMENTS

| | | | |
|---|---|---|---|
| 5,378,312 A | | 1/1995 | Gifford et al. |
| 5,931,721 A | * | 8/1999 | Rose ............... B08B 7/0092 |
| | | | 451/39 |
| 5,976,264 A | | 11/1999 | McCullough et al. |
| 6,391,785 B1 | * | 5/2002 | Satta ............... H01L 23/53252 |
| | | | 257/E21.171 |
| 6,500,758 B1 | | 12/2002 | Bowers |
| 6,551,929 B1 | | 4/2003 | Kori |
| 7,066,789 B2 | | 6/2006 | Tannous |
| 8,197,603 B2 | | 6/2012 | Jackson |
| 2002/0117399 A1 | | 8/2002 | Chen |
| 2009/0126760 A1 | * | 5/2009 | Banerjee ......... H01L 21/67161 |
| | | | 134/1 |
| 2010/0078846 A1 | * | 4/2010 | Resnick ............ B82Y 10/00 |
| | | | 264/101 |
| 2011/0198736 A1 | * | 8/2011 | Shero ............... C23C 16/45525 |
| | | | 257/629 |

* cited by examiner

METHODS AND APPARATUS FOR CRYOGENIC GAS STREAM ASSISTED SAM-BASED SELECTIVE DEPOSITION

CROSS-REFERENCE TO RELATED APPLICATIONS

This application claims priority to U.S. Provisional Application No. 62/614,876, filed Jan. 8, 2018, the entire disclosure of which is hereby incorporated by reference herein.

FIELD

Embodiments of the disclosure generally relate to methods of removing deposition in self-assembled monolayer (SAM) based selective deposition process schemes. More particularly, some embodiments of the disclosure are directed to methods and apparatus for removing deposition in self-assembled monolayer (SAM) based selective depositions which utilize cryogenic aerosols to removed deposition from SAM protected surfaces.

BACKGROUND

As the design of semiconductor devices evolve, precision material manufacturing in the semiconductor industry has entered an era of atomic scale dimensions. At the atomic scale, with only tens of atoms at stake, there is no margin for error, i.e., every atom matters. This unprecedented challenge demands new material processing techniques which have atomic level precisions. However, increasing complexity of the process flow required in atomic scale device manufacturing can significantly increase the cost of manufacturing.

Selective deposition technology offers the potential for chemically-selective atomic-layer precision in semiconductor film patterning. Selective deposition also offers the potential for simpler process flows by eliminating lithography or other process steps.

One form of selective deposition, based on long-chain carbon-based self-assembled monolayers (SAMs), has been proposed as a method for depositing a sacrificial layer in various selective deposition schemes. A feature of selective deposition process flows based on SAMs is the degree to which a high-quality SAM can be grown on part of the structure (e.g. dielectric surfaces) without depositing any SAM on other parts of the structure (e.g. metal surfaces).

To achieve atomic level material processing and maintain low cost at the same time, self-assembled monolayer (SAM) based selective deposition techniques have been developed. SAM based selective deposition techniques combine the selectivity of SAM and ultra-high precision of atomic layer deposition (ALD) providing chemically-selective atomic-layer precision in semiconductor film patterning with a fundamentally simplified process flow, i.e., with high precision and low cost.

In the selective deposition flow, long-chain carbon-based SAM serves as a sacrificial layer which forms closely packed monolayer on part of the structure (e.g. dielectric films) leaving the other part of the structure untouched (e.g. metal films). Accordingly the quality of SAM film, i.e. high SAM molecular packing density, is used to achieve high quality selectively deposited ALD films.

Ideally, during the SAM deposition step, the SAM film forms over all dielectric surfaces and blocks all metal oxide deposition during the following processes; so that metal oxide only forms on conductive surfaces. However, the SAM grows in an asymptotic thickness vs deposition time and number of cycles. It remains a challenge to achieve an ideal monolayer SAM that provides complete blocking of the dielectric surface due to its throughput and defect concerns. Furthermore, the SAM layer quality may also degrade during subsequent metal oxide processes due to potentially harsh process conditions (e.g. high temperature, reactive chemicals). This effect makes a complete blocking of metal oxide even more challenging.

Therefore, in the absence of perfect blocking, a methodology is needed to remove unwanted deposits to improve overall process selectivity.

SUMMARY

One or more embodiments of the disclosure are directed to a method comprising providing a substrate comprising a first surface and a second surface. The substrate is exposed to a SAM precursor to selectively form a SAM layer on the first surface over the second surface. The SAM layer contains defects that expose portions of the first surface. A film is deposited on the second surface and exposed portions of the first surface. The film has a first average thickness on the first surface and a second average thickness on the second surface. The first average thickness is less than the second average thickness. The substrate is exposed to a cryogenic gas stream to remove an amount of the film from the exposed portions of the first surface.

Other embodiments of the disclosure are directed to a processing chamber comprising a chamber body, a gas distribution assembly, a susceptor and a high-speed cryogenic nozzle. The chamber body has a bottom and sidewall. The gas distribution assembly has a front surface to provide a flow of gas into an interior of the processing chamber. The susceptor is located within the interior of the processing chamber and has a top surface facing the front surface of the gas distribution assembly. The top surface of the susceptor and front surface of the gas distribution assembly define a process volume. The high-speed cryogenic gas nozzle has an outlet directed to provide a cryogenic gas stream into the process volume. The cryogenic gas stream has a spray pattern so that when a substrate is present in the process volume, the spray pattern has a spray area on the substrate.

Further embodiments of the disclosure are directed to a method comprising positioning a substrate on a susceptor in a processing chamber. The substrate comprises a first surface and a second surface. A flow of a SAM precursor is provided to the substrate through a gas distribution assembly positioned so that a front face of the gas distribution assembly faces a top surface of the susceptor. The front face of the gas distribution assembly and the top surface of the susceptor define a process volume. The SAM precursor selectively forms a SAM layer on the first surface over the second surface. The SAM layer contains defects that expose portions of the first surface. A flow of one or more deposition gases is provided through the gas distribution assembly to deposit a film on the second surface and exposed portions of the first surface. The film has a first average thickness on the first surface and a second average thickness on the second surface. The first average thickness is less than the second average thickness. A cryogenic gas stream is provided with a spray pattern and a spray area from a high-speed cryogenic gas nozzle into the process volume to remove an amount of the film from the exposed portions of the first surface. The cryogenic gas stream has a root mean square velocity greater than or equal to about 340 m/s.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
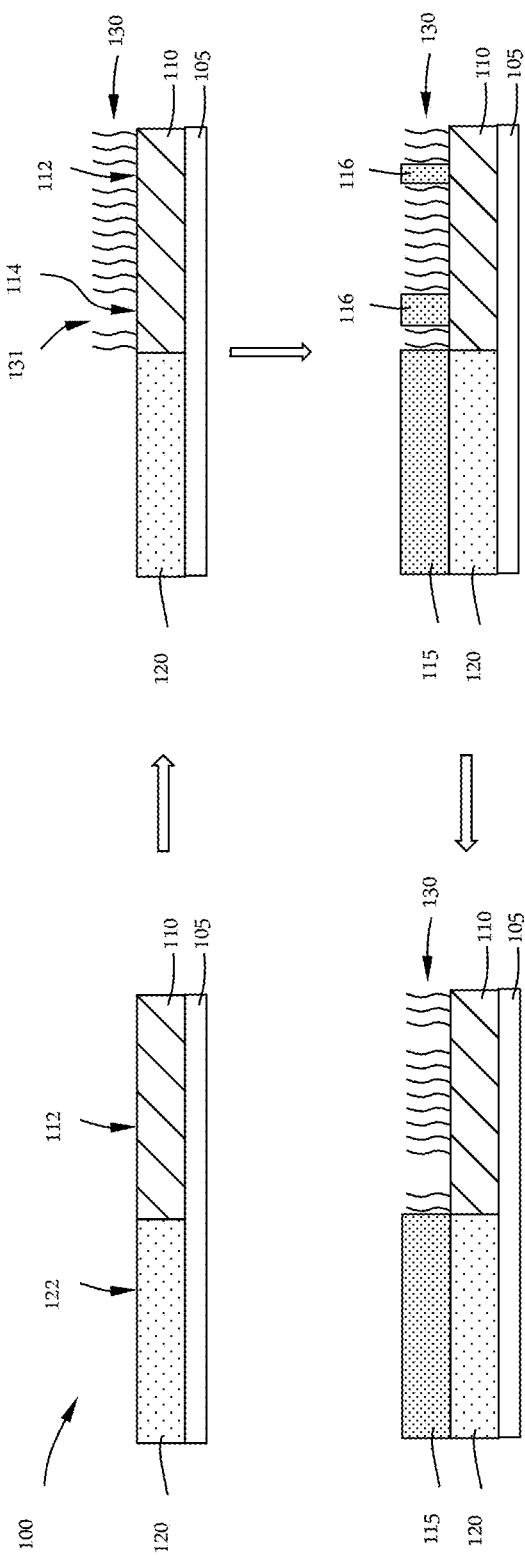
FIG. 1 illustrates a processing method in accordance with one or more embodiment of the disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

Further, a "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

What a given substrate surface comprises will depend on what films are to be deposited, as well as the particular chemistry used. As used herein, a "patterned substrate" refers to a substrate with a plurality of different material surfaces. In some embodiments, a patterned substrate comprises a first surface and a second surface. In some embodiments, the first surface comprises a dielectric material and the second surface comprises a conductive material. In some embodiments, the first surface comprises a conductive material and the second surface comprises a dielectric material.

As used in this specification and the appended claims, the terms "reactive gas", "process gas", "precursor", "reactant", and the like, are used interchangeably to mean a gas that includes a species which is reactive with a substrate surface. For example, a first "reactive gas" may simply adsorb onto the surface of a substrate and be available for further chemical reaction with a second reactive gas.

Embodiments of the disclosure provide methods and apparatuses for enhancing the effective selectivity of SAM-based selective depositions. As used in this specification and the appended claims, the term "selectively depositing on a first surface over a second surface", and the like, means that a first amount of a film or layer is deposited on the first surface and a second amount of film or layer is deposited on the second surface, where the second amount of film is less than the first amount of film, or no film is deposited on the second surface. The term "over" used in this regard does not imply a physical orientation of one surface on top of another surface but rather a relationship of the thermodynamic or kinetic properties of the chemical reaction with one surface relative to the other surface. For example, selectively depositing a cobalt film onto a copper surface over a dielectric surface means that the cobalt film deposits on the copper surface and less or no cobalt film deposits on the dielectric surface; or that the formation of the cobalt film on the copper surface is thermodynamically or kinetically favorable relative to the formation of a cobalt film on the dielectric surface.

One strategy to achieve selective deposition employs the use of blocking layers in which a blocking layer is formed on substrate materials upon which deposition is to be avoided with negligible impact to the target substrate material. A film can be deposited on the target substrate material while deposition on other substrate materials is "blocked" by the blocking layer. The blocking layer can be optionally removed without net adverse effects to the deposited film.

Some embodiments of the disclosure incorporate a blocking layer typically referred to as a self-assembled monolayer (SAM) or SAM layer. A self-assembled monolayer (SAM) consists of an ordered arrangement of spontaneously assembled organic molecules (SAM molecules) adsorbed on a surface. These molecules are typically comprised of one or more moieties with an affinity for the substrate (head group) and a relatively long, inert, linear hydrocarbon moiety (tail group). SAM molecules are fundamentally a surfactant which has a hydrophilic functional head with a hydrophobic carbon chain tail.

SAM formation happens through fast adsorption of molecular head groups at the surface and slow association of molecular tail groups with each other through van der Waals interactions. SAM precursors are chosen such that the head group selectively reacts with the substrate materials to be blocked during deposition. Deposition is then performed, and the SAMs can be removed, for example through a thermal decomposition (with desorption of any byproducts) or an integration-compatible ashing process.

A representative process flow for selective deposition may include a) providing a patterned substrate, b) growing a SAM (either by CVD, ALD, or immersion), and c) selective deposition (e.g. ALD) of a film. In the representative process flow, the SAM is used as a sacrificial layer to enable the selective ALD deposition.

Fundamentally the SAM growth on a surface is a chemisorption process. Determined by chemisorption kinetics, the coverage of a SAM layer follows the Elovich equation $$\frac{d_q}{d_t} = \alpha \exp(-\beta q)$$

where q is the amount of chemisorption, t is time, $\alpha$ is the initial rate of chemisorption (mmol/g-min) and $\beta$ is the desorption constant (g/mmol). Accordingly the coverage of a SAM layer as the function of time follows an asymptotic trend. As a result, the selectivity of ALD depositions follows a similar trend as well (i.e. as coverage increases, selectivity also increases).

Due to the imperfect coverage of SAM layers and potential degradation during subsequent ALD processes, deposition may occur and grow/form small deposits on the protected surface (i.e. the surface with the SAM). The existence of deposits on the protected surface is detrimental for the effective selectivity of the process and may cause device yield issues. To address this issue, the growth of deposits on protected surfaces can be suppressed during deposition, or deposits on the protected surface can be removed after deposition.

In this disclosure, some embodiments relate to methods and apparatus for the use of cryogenic aerosol streams to remove deposits from protected surfaces after a selective deposition process. In some embodiments, solid phase cryogenic gas clusters are generated and accelerated to high speed. Without being bound by theory, it is believed that the momentum carried in the cluster is partially transferred to deposits when a collision happens. Due to this momentum transfer, the deposits are detached from the substrate surface and carried away by a purging gas. Additionally, the cryogenic gas clusters break in the collision and vaporize into a gas which is pumped away.

The inventors have found that there is an observable difference of the amount of deposition on the protected surfaces seen in SEM images of substrates treated with the disclosed methods and apparatus relative to those left untreated. Similar results were seen on both blanket substrates and patterned substrates.

Referring to FIG. 1, one or more embodiment of the disclosure is directed to a processing method 100. A substrate 105 is provided with a first material 110 and a second material 120. The first material 110 has a first surface 112 and the second material 120 has a second surface 122. The first surface 112 is on a first material 110 and the second surface 122 is on a second material 120 different from the first material 110.

In some embodiments, the first material 110 comprises a dielectric material and the second material 120 comprises a conductive material. In some embodiments, the first material 110 comprises a conductive material and the second material 120 comprises a dielectric material. In some embodiments, the dielectric material comprises one or more of silicon oxide, silicon nitride or silicon carbide. In some embodiments, the conductive material comprises one or more of ruthenium, copper or cobalt. In some embodiments, the first surface comprises a dielectric material consisting essentially of silicon nitride and the second surface conductive material consisting essentially of ruthenium. As used in this specification and the appended claims, the term "consists essentially of" means that greater than or equal to about 95%, 98% or 99% of the specified material is the stated material.

The substrate (including the first surface 112 and the second surface 122) is exposed to a SAM precursor to selectively form a SAM layer 130 on the first material 110 (or first surface 112) over the second material (or second surface 122). The SAM layer 130 contains defects 131 that expose portions 114 of the first surface 112.

The substrate may be exposed to the SAM precursor by any suitable process. In some embodiments, the substrate is exposed to the SAM precursor by a chemical vapor deposition (CVD) process. In some embodiments, the substrate is exposed to the SAM precursor by an ALD process. In some embodiments, the substrate is exposed to the SAM precursor by an immersion or "wet" process.

The SAM precursor may be any compound capable of selectively forming a SAM layer on the first surface over the second surface. In general, the SAM precursor comprises at least one blocking molecule. A blocking molecule has the general formula A-L, where A is a reactive head group and L is a tail group. In some embodiments, a reactive group can be included at the end of the tail group opposite the head group.

As used in this manner, the "head group" is any chemical moiety that associates with the first surface 112 and the "tail group" is any chemical moiety that extends away from the first surface 112.

In some embodiments, the first material comprises a dielectric material and A is selected from the group consisting of $(R_2N)_{(3-a)}R'_aSi-$, $X_3Si-$ and $(RO)_3Si-$, where each R and R' is independently selected from C1-C6 alkyl, C1-C6 cycloakyl and C1-C6 aryl, a is an integer from 0 to 2, and each X is independently selected from halogens.

In some embodiments, the first material comprises a conductive material and A is selected from the group consisting of $(R''O)_2OP-$, $HS-$ and $H_3Si-$, where each R'' is independently selected from hydrogen, C1-C6 alkyl, C1-C6 cycloakyl and C1-C6 aryl. In some embodiments, the head group comprises $(HO)_2OP-$.

Some of the reactive head groups comprise more than one reactive moiety in a single reactive head group (e.g. $H_3Si-$ may bond up to three times with the surface) which is attached to tail group, L. In some embodiments, A comprises a reactive group connected to more than one tail group L. In these embodiments, each of the tail groups may be the same or different.

In some embodiments, L is $-(CH_2)_nCH_3$ and n is an integer from 3 to 24. In some embodiments, L is $-(CH_2)_n-$ and n is an integer from 4 to 18 and a reactive group is on the end of the tail group opposite the head group. In some embodiments, the tail group may be branched. In some embodiments, the tail group may be substituted. In some embodiments, the tail group may be unsaturated. In some embodiments, the tail group may comprise cycloakyl or aryl groups.

In some embodiments, the SAM includes a reactive group Z. The reactive group Z of some embodiments is a group comprising one or more reactive moiety selected from alkenes, alkynes, alcohols, carboxylic acids, aldehydes, acyl halides, amines, amides, cyanates, isocyanates, thiocyanates, isothiocyanates, or nitriles.

In some embodiments, the blocking molecule comprises more than one reactive moiety. In some embodiments, A is linked to more than one tail group each terminated with a reactive tail group, such that a blocking molecule comprises more than one reactive moiety. In some embodiments, L is branched, such that a blocking molecule comprises more than one reactive moiety.

In some embodiments, the blocking molecule comprises more than one reactive moiety and the reactive moieties are positioned in a linear fashion. In some embodiments, Z comprises more than one reactive moiety and the reactive moieties are positioned in a branched fashion. As used in this manner, reactive moieties positioned in a linear fashion are positioned within a blocking molecule such than they are positioned within the same carbon chain. In other words, they are positioned end-to-end. As used in this manner, reactive moieties positioned in a branched fashion are positioned within a blocking molecule such than they are positioned on different carbon chains. In other words, they are not positioned end-to-end. In some embodiments, the reactive moieties may be separated by intervening atoms but still be considered end-to-end.

For example, Compound I contains one reactive moiety. Compounds II and III each contain two reactive moieties. Compound II has reactive moieties positioned in a linear fashion. Compound III has reactive moieties positioned in a branched fashion.

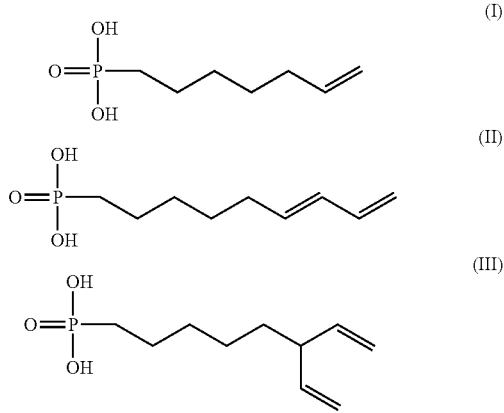

In some embodiments, the tail groups associate with each other through relatively slow van der Waals interaction. In some embodiments, the tail groups can be the same or different so that a homogeneous or heterogeneous SAM can be formed. In some embodiments, the SAM precursor comprises at least two different blocking molecules so that a heterogeneous SAM is formed.

The SAM precursor can be delivered to the substrate as a single compound or sequential exposures of multiple compounds to form the SAM layer 130. In some embodiments, the first surface 112 is exposed to a single compound that assembles on the surface in an ordered or semi-ordered manner.

In some embodiments, the SAM layer 130 contains defects 131. A defect 131 is a gap or void in the SAM layer where no SAM molecule has reacted with the first surface 112 to inhibit subsequent deposition. The defects expose portions 114 of the first surface 112, referred to herein as exposed portions 114 of the first surface 112.

After formation of the SAM layer 130, a film 115 is deposited on the second surface 122. The defects 131 in the SAM layer 130 allow for formation of deposits 116 of the film 115 to form on the exposed portions 114 of the first surface 112. The amount of the film 115 formed on the first surface 112 is less than the amount of the film formed on the second surface 122. A measurement of the amount of film 115 formed on the surfaces can be the average thickness of the film formed on each surface. In some embodiments, the film 115 has a first average thickness on the first surface 112 and a second average thickness on the second surface 122. Described differently, the deposition of the film 115 may be described as selectively depositing a film 115 on the second surface 122 over the first surface 112. While the film 115 depicted in FIG. 1 has an equal thickness on the second surface 122 and the exposed portions of the first surface 112, this is shown for exemplary purposes only.

In some embodiments, the film 115 comprises a metal oxide. As used in this regard, a metal oxide is any material comprising a metal or silicon atoms and oxygen atoms. The metal oxide may or may not comprise a stoichiometric ratio of metal to oxygen.

The film 115 may be deposited by any suitable process. In some embodiments, the film 115 is deposited by CVD. In some embodiments, the film 115 is deposited by ALD. In some embodiments, the film 115 is deposited by exposing the substrate to a plurality of reactants. In some embodiments, the plurality of reactants is exposed to the substrate separately. In some embodiments, the plurality of reactants is separated temporally. In some embodiments, the plurality of reactants is separated spatially.

Next, the substrate is exposed to a cryogenic gas stream to remove an amount of the film 115 from the first surface 112. The deposits 116 of the film 115 formed on the first surface 112 in FIG. 1 have been illustrated as being completely removed from the first surface 112. This is merely for descriptive purposes and should not be taken as limiting the scope of the disclosure or process. The amount of film removed from the first surface 112 may be any amount. In some embodiments, the cryogenic gas stream removes substantially all of the film from the first surface. As used in this regard, removing substantially all of the film means that greater than 95, 98, 99 or 99.5% of the volume of the film on the first surface is removed. In some embodiments, removing substantially all of the film means that greater than or equal to about 95, 98, 99 or 99.5% of the average thickness of the film on the first surface has been removed.

The cryogenic gas stream may be any suitable gas capable of physically removing an amount of the film from the first surface. In some embodiments, the cryogenic gas stream comprises one or more of $CO_2$, $N_2$, Ar or Ne.

In some embodiments, the cryogenic gas stream comprises an aerosol of particles of cryogenic gas clusters. In some embodiments, the cryogenic gas clusters comprise one or more of $CO_2$, $N_2$, Ar or Ne. In some embodiments, the particles have a root mean square velocity greater than or equal to about 340 m/s. In some embodiments, the particles are supersonic. In some embodiments, the particles have a root mean square velocity in a range of about 350 m/s (about Mach 1) to about 1750 m/s (about Mach 5). In some embodiments, the particles have a root mean square velocity greater than or equal to about 350 m/s, 400 m/s, 600 m/s, 800 m/s, 1000 m/s, 1200 m/s, 1400 m/s or 1600 m/s. In some embodiments, the particles have a root mean square velocity greater than or equal to about Mach 1.5, Mach 2, Mach 2.5, Mach 3, Mach 3.5, Mach 4 or Mach 4.5.

In some embodiments, the SAM layer 130 is substantially unaffected by the cryogenic gas stream. In some embodiments, the film 115 on the second surface 122 is substantially unaffected by the cryogenic gas stream. As used in this regard, substantially unaffected by the cryogenic gas stream means that greater than 95, 98, 99, or 99.5% of the subject layer/film present before exposure to the cryogenic gas stream remains on the substrate after exposure to the cryogenic gas stream.

In some embodiments, after an amount of the film is removed from the first surface, each of the deposition of the film 115 and/or exposure to the cryogenic gas stream is repeated at least once to form a film selectively on the second surface 122 having a predetermined thickness. The deposition and exposure to the cryogenic gas stream is referred to as a cycle. A cycle may be performed in whole or in part until a predetermined thickness of film has been deposited on the second surface. In some embodiments, the deposition occurs more frequently than the cryogenic gas stream exposure. For example, film deposition may occur by an atomic layer deposition process in which a first reactive gas and a second reactive gas are sequentially exposed to the substrate to form the film. The sequential exposure of the first reactive gas and the second reactive gas may occur once for each cryogenic gas stream exposure, or there can be more than one sequential exposure to the first reactive gas and the second reactive gas before exposure to the cryogenic gas stream.

EXAMPLES

Figures 5A, 5B:
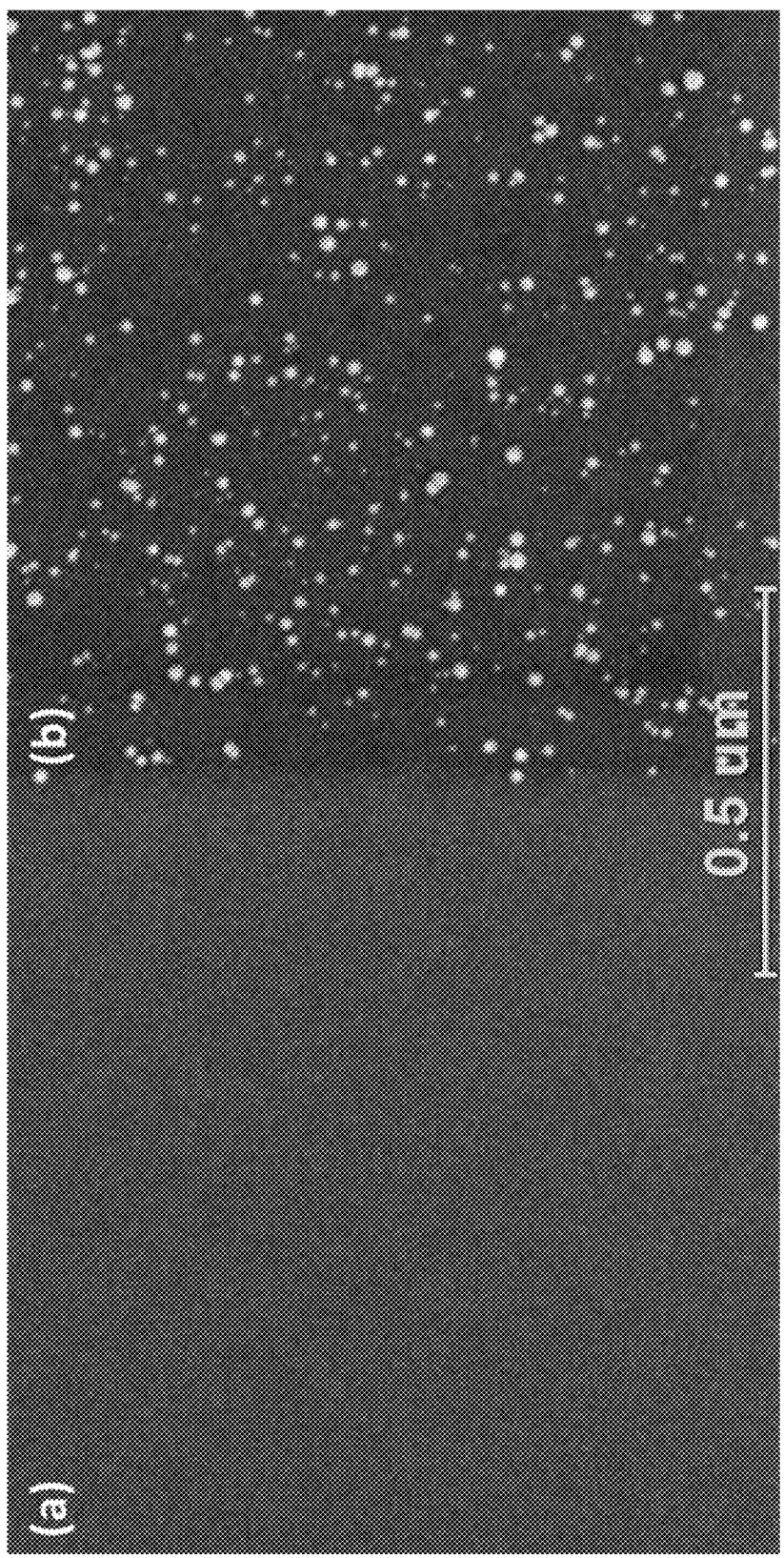
FIGS. 5A and 5B illustrate the results from a processing method in accordance with one or more embodiment of the disclosure on a blanket dielectric substrate.

A blanket wafer of silicon was exposed to air to form a native oxide layer on the wafer. The wafer was exposed to a SAM precursor to form a SAM layer on the wafer. A metal oxide was deposited on the wafer. FIG. 5B shows a top down SEM image of the substrate after deposition. The lighter spots on the substrate are metal oxide deposits of various sizes. FIG. 5A shows a top down SEM image of the substrate after processing with a $CO_2$ cryogenic gas stream. It shows that substantially all of the metal oxide deposits have been removed.

Figures 6A, 6B:
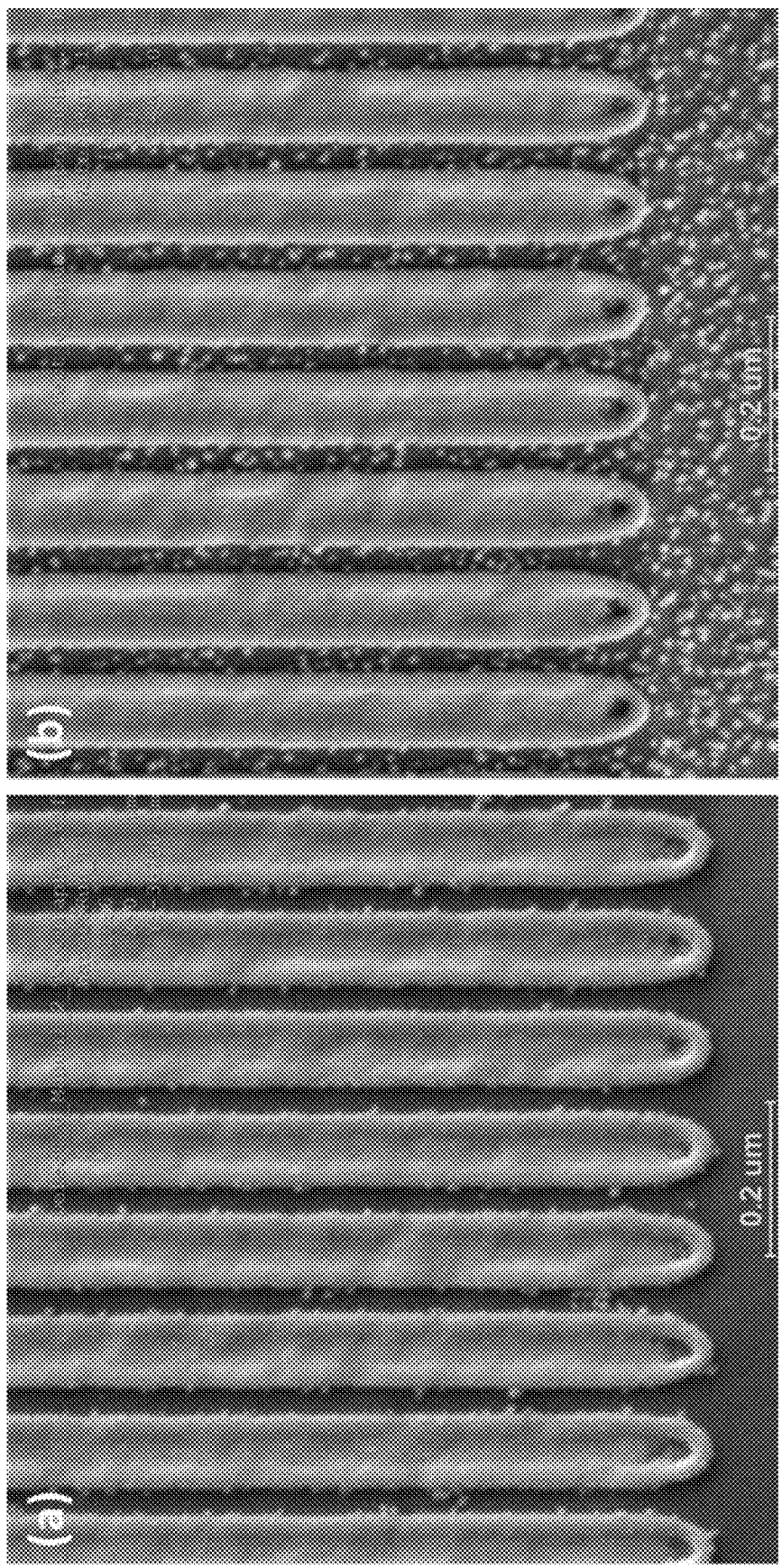
FIGS. 6A and 6B illustrate the results from a processing method in accordance with one or more embodiment of the disclosure on a patterned substrate.

A patterned wafer of metal lines on a dielectric surface was also tested. The metal lines were ruthenium and the dielectric surface was silicon nitride. The wafer was exposed to a SAM precursor to form a SAM layer on the dielectric surface. A metal oxide was deposited on both the metal lines and the dielectric surface of the wafer. FIG. 6B shows a top down SEM image of the wafer after deposition. FIG. 6A shows a top down SEM image of the wafer after processing with a $CO_2$ cryogenic gas stream. It shows that most of the metal oxide deposits have been removed and no surface damage to the metal lines.

Figure 2:
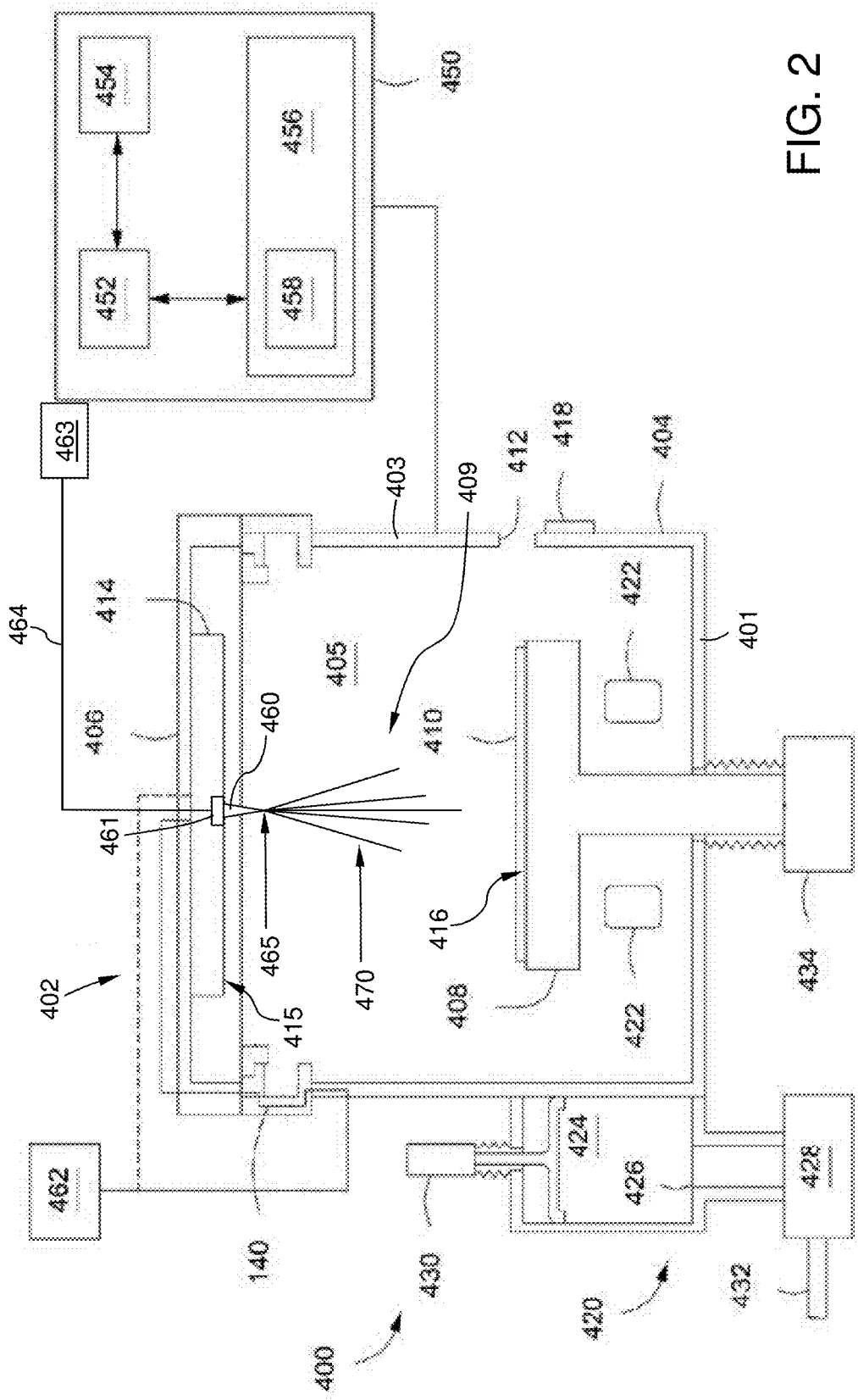
FIG. 2 illustrates an exemplary processing chamber in accordance with one or more embodiments of the disclosure.

Additional embodiments of this disclosure are directed to a processing chamber. FIG. 2 depicts a system 400 suitable for processing a substrate in accordance with some embodiments of the disclosure. The system 400 may comprise a controller 450 and a process chamber 402 having an exhaust system 420 for removing process gases, processing byproducts, or the like, from the interior of the process chamber 402.

In some embodiments, the process chamber 402 has a chamber body 404. The chamber body has a bottom 401 and a sidewall 403. In some embodiments, the process chamber has a chamber lid 406. The chamber body 404 and the chamber lid 406 generally enclose an interior 405 of the processing chamber.

In some embodiments, the chamber lid 406 comprises a gas distribution assembly 414. In some embodiments, the gas distribution assembly 414 is coupled to the chamber lid 406. In some embodiments, the gas distribution assembly 414 is separate from the chamber lid 406. The gas distribution assembly 414 has a front surface 415 which provides a flow of gas into the interior 405 of the processing chamber 402. In some embodiments, the gas distribution assembly 414 comprises one or more gas inlets, such as a showerhead and/or nozzles provided at predetermined locations.

A susceptor 408 is located within the interior 405 of the processing chamber 402. The susceptor 408 has a top surface 416 facing the front surface 415 of the gas distribution assembly 414. In some embodiments, the susceptor 408 is configured to support a substrate 410 thereupon during processing. In some embodiments, the susceptor 408 may include one or more components that retains or supports the substrate 410 on the surface of the susceptor 408, such as an electrostatic chuck, a vacuum chuck, a substrate retaining clamp, or the like (not shown). In some embodiments, the susceptor 408 may include components for controlling the substrate temperature, such as cooling devices or heating devices (not shown).

The process volume 409 may be defined as the region between the top surface 416 of the susceptor 408 and the front surface 415 of the gas distribution assembly 414.

At least one high-speed cryogenic gas nozzle 460 is positioned within the interior 405 of the processing chamber 402. In some embodiments, the high-speed cryogenic nozzle 460 is located within or coupled to the gas distribution assembly 414. The high-speed cryogenic gas nozzle 460 has an outlet 465 directed to provide a cryogenic gas stream 470 into the process volume 409.

The high-speed cryogenic gas nozzle 460 can be configured to provide a flow of gas at any suitable velocity. In some embodiments, the high-speed cryogenic gas nozzle 460 is configured to provide the cryogenic gas stream 470 into the process volume 409 with a root mean square velocity greater than or equal to about 340 m/s. In some embodiments, the high-speed cryogenic gas nozzle 460 is configured to provide the cryogenic gas stream 470 into the process volume 409 with a root mean square velocity greater than or equal to about Mach 1. In some embodiments, the high-speed cryogenic gas nozzle 460 is configured to provide the cryogenic gas stream 470 into the process volume 409 with a root mean square velocity in the range of about 350 m/s to about 1750 m/s. In some embodiments, the high-speed cryogenic gas nozzle 460 is configured to provide the cryogenic gas stream 470 into the process volume 409 with a root mean square velocity in the range of about Mach 1 to about Mach 5. In some embodiments, the high-speed cryogenic gas nozzle 460 is configured to provide a flow of gas into the process volume 409 with a root mean square velocity greater than or equal to about 400 m/s, 600 m/s, 800 m/s, 1000 m/s, 1200 m/s, 1400 m/s or 1600 m/s. In some embodiments, the high-speed cryogenic gas nozzle 460 is configured to provide a flow of gas into the process volume 409 with a root mean square velocity greater than or equal to about Mach 1.5, Mach 2, Mach 2.5, Mach 3, Mach 3.5, Mach 4 or Mach 4.5.

The high-speed cryogenic gas nozzle 460 may be any suitable shape. In some embodiments, the high-speed cryogenic gas nozzle 460 is a converging-diverging nozzle. In a converging-diverging nozzle, gas flows from a region of high pressure into a converging portion of the nozzle, past a constriction to a diverging portion. The gas exits the diverging portion at increased pressure and/or high velocity.

At least one high-speed cryogenic gas nozzle 460 is oriented to direct a cryogenic gas stream 470 toward the top surface 416 of the susceptor 408. The high-speed cryogenic gas nozzle 460 can generally be adapted to deliver a cryogenic gas stream 470 to process either certain regions of the substrate surface or the entire substrate surface.

In some embodiments, the cryogenic gas stream 470 is moveable relative to the top surface 416 of the susceptor. In some embodiments, the top surface 416 of the susceptor 408 may be moved while the cryogenic gas stream 470 remains fixed. For example, the cryogenic gas stream 470 may be directed at an edge of the substrate 410 and the susceptor 408 can be rotated.

In some embodiments, at least one actuator 461 moves the high-speed cryogenic gas nozzle 460 so that the cryogenic gas stream 470 is moved across the top surface 416 of the susceptor assembly which remains relatively fixed. The actuator 461 can be a motor that physically changes the position or orientation of the high-speed cryogenic gas nozzle 460. The actuator 461 may cause the cryogenic gas stream 470 to be scanned or rastered across the surface of the susceptor assembly. The movement of the cryogenic gas stream 470 across the susceptor assembly can be smooth or rasterized. For example, the movement can be made up of a number of tiny steps occurring quickly enough to appear as a smooth movement.

Some embodiments may include a controller to control the actuator 461. The controller can be any suitable controller capable of accurately controlling the actuator. In some embodiments, the controller can be programed to move the cryogenic gas stream 470 by adjusting the actuator 461 so that the cryogenic gas stream 470 moves in a substantially straight path. As used in this specification and the appended claims, the term "substantially straight" means that there is less than a 1% absolute deviation in the linearity over the length of the movement.

The rate of movement of the cryogenic gas stream 470 can be adjusted depending on the cryogenic gas stream employed, the root mean square velocity of the stream, the film being processed, the SAM layer and the processing chamber. In some embodiments, the controller may move the cryogenic gas stream 470 at a substantially uniform rate.

In a sector type system where a susceptor (typically accommodating multiple substrates) rotates about a central axis, the movement of the cryogenic gas stream 470 can be uniform or graded. When rotational movement of the susceptor assembly is taken into consideration, the outer peripheral edge of the susceptor assembly is moving faster than the inner peripheral edge. Therefore, uniform movement across the susceptor assembly would mean that there is relatively less exposure to the cryogenic gas stream 470 per unit area near the outer diameter region than at the inner diameter region. This may not have a significant impact on the overall processing of the film as the cryogenic gas stream 470 may be moving at a much faster rate than the rotation of the susceptor assembly so that the difference in residence times at the inner and outer regions is negligible or does not have an impact on the removal of the film.

In some embodiments, the controller moves the high-speed cryogenic gas nozzle 460, and therefore the cryogenic gas stream 470, so that the cryogenic gas stream 470 moves slower at the outer diameter region than at the inner diameter region. The variable rate of movement can be tuned so that the residence time of the cryogenic gas stream 470 is substantially uniform over the range of movement.

In some embodiments, a variable focus nozzle can be incorporated so that the spray area of the cryogenic gas stream 470 at the inner diameter region is smaller than the spray area of the cryogenic gas stream 470 at the outer diameter region. The spray area of the cryogenic gas stream 470 refers the area affected by the cryogenic gas stream 470 at any given time.

Figure 3:
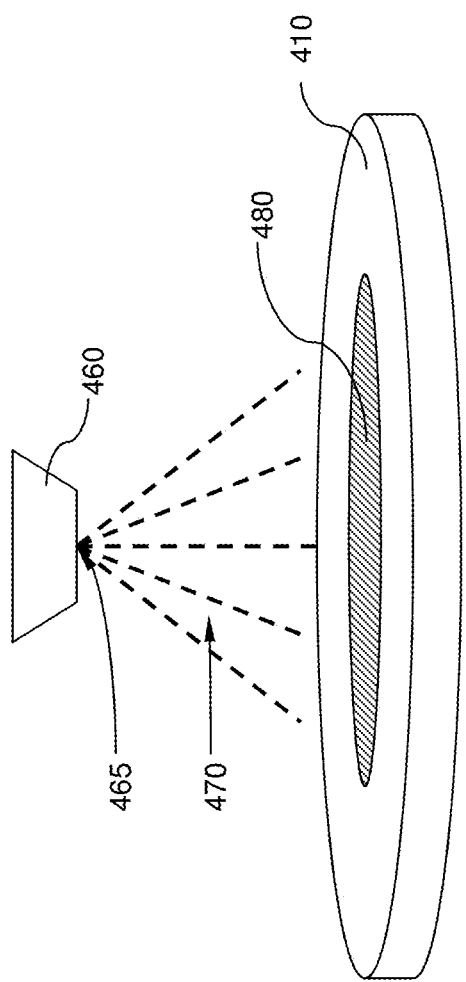
FIG. 3 illustrates a spray pattern on a substrate in accordance with one or more embodiment of the disclosure.

As illustrated in FIG. 3, the cryogenic gas stream 470 has a spray pattern 480 so that when a substrate 410 is present in the process volume 409, the spray pattern has a spray area on the substrate 410. In some embodiments, the spray area is greater than or equal to about 0.5 $cm^2$. In some embodiments, the spray area is greater than or equal to about 0.1 $cm^2$, 0.2 $cm^2$, 0.3 $cm^2$, 0.4 $cm^2$, 0.6 $cm^2$, 0.7 $cm^2$ or 0.8 $cm^2$. In some embodiments, the spray area is in the range of about 0.05 $cm^2$ to about 1.5 $cm^2$, or in the range of about 0.1 $cm^2$ to about 1 $cm^2$, or in the range of about 0.2 $cm^2$ to about 0.8 $cm^2$.

Figure 4C:
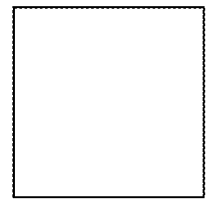
FIGS. 4A, 4B and 4C illustrate various exemplary spray patterns in accordance with one or more embodiment of the disclosure.
Figure 4B:
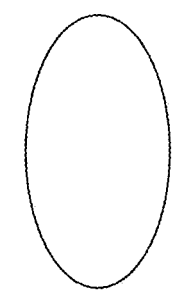
Figure 4A:
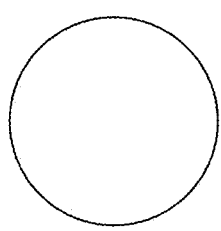

The shape of the spray pattern 480 can vary depending on, for example, the nozzle 460 and outlet 465. FIGS. 4A through 4C illustrate non-limiting embodiments of spray patterns 480. In FIG. 4A, the spray pattern 480 is round. In FIG. 4B, the spray pattern 480 is an ovoid. In FIG. 4C, the spray pattern 480 is square or rectangular.

Referring back to FIG. 2, the substrate 410 may enter the process chamber 402 via an opening 412 in a sidewall 403 of the process chamber 402. The opening 412 may be selectively sealed via a slit valve 418, or other mechanism for selectively providing access to the interior 405 of the chamber through the opening 412. The susceptor 408 may be coupled to a lift mechanism 434 that may control the position of the susceptor 408 between a lower position (as shown) suitable for transferring substrates into and out of the chamber via the opening 412 and a selectable upper position suitable for processing. The process position may be selected to maximize process uniformity for a particular process. When in at least one of the elevated processing positions, the susceptor 408 may be disposed above the opening 412 to provide a symmetrical processing region.

A gas supply 462 may be coupled to the gas distribution assembly 414 to provide one or more process gases to the gas distribution assembly 414 for processing. For example, the gas supply 462 may be coupled to the chamber body 404 so that the gas travels through the housing (e.g., via conduits 140), and through the chamber lid 406 to the gas distribution assembly 414. Alternatively, the gas supply 462 may be coupled directly to the gas distribution assembly 414, as shown in phantom. Although a gas distribution assembly 414 is shown in FIG. 2, additional or alternative gas inlets may be provided such as nozzles or inlets disposed in the ceiling or on the sidewalls of the process chamber 402 or at other locations suitable for providing gases to the process chamber 402, such as the base of the process chamber, the periphery of the susceptor, or the like.

In some embodiments, a cryogenic gas supply 463 is fluidly connected to the high-speed cryogenic gas nozzle 460 by a cryogenic gas supply conduit 464. In some embodiments, a cryogenic gas supply conduit 464 is connected to the high-speed cryogenic gas nozzle 460. In some embodiments, the cryogenic gas supply is contained within the gas supply 462. In some embodiments, as shown, the cryogenic gas supply 463 is separate from the gas supply 462. In some embodiments, the cryogenic gas supply conduit 464 has a metallic interior surface. Without being bound by theory, it is believed that the metallic surface is less reactive with the cryogenic gases of this disclosure than similar polymeric interior conduit surfaces.

The exhaust system 420 generally includes a pumping plenum 424 and one or more conduits that couple the pumping plenum 424 to the interior 405 (and generally, the process volume 409) of the process chamber 402, for example via one or more inlets 422 (two inlets shown in FIG. 2). A vacuum pump 428 may be coupled to the pumping plenum 424 via a pumping port 426 for pumping out the exhaust gases from the process chamber 402. The vacuum pump 428 may be fluidly coupled to an exhaust outlet 432 for routing the exhaust as needed to appropriate exhaust handling equipment. A valve 430 (such as a gate valve, or the like) may be disposed in the pumping plenum 424 to facilitate control of the flow rate of the exhaust gases in combination with the operation of the vacuum pump 428. Although a z-motion gate valve is shown, any suitable, process compatible valve for controlling the flow of the exhaust may be utilized.

To facilitate control of the process chamber 402 as described above, the controller 450 may be one of any form of general-purpose computer processor that can be used in an industrial setting for controlling various chambers and sub-processors. The memory, or computer-readable medium, 456 of the CPU 452 may be one or more of readily available memory such as random access memory (RAM), read only memory (ROM), floppy disk, hard disk, or any other form of digital storage, local or remote. The support circuits 454 are coupled to the CPU 452 for supporting the processor in a conventional manner. These circuits include cache, power supplies, clock circuits, input/output circuitry and subsystems, and the like.

Processes may generally be stored in the memory 456 as a software routine 458 that, when executed by the CPU 452, causes the process chamber 402 to perform processes of the present disclosure. The software routine 458 may also be stored and/or executed by a second CPU (not shown) that is remotely located from the hardware being controlled by the CPU 452. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine 458 may be executed after the substrate 410 is positioned on the susceptor 408. The software routine 458, when executed by the CPU 452, transforms the general purpose computer into a specific purpose computer (controller 450) that controls the chamber operation such that the processes are performed.

The controller 450 can include one or more of a non-transient memory (e.g., a hard disk drive) or a transient memory (e.g., random access memory (RAM)) which can store, load and/or operate a program to control the processing chamber. The controller 450 can include circuits and electronics configured to interface with and control components of the processing chamber. In some embodiments, the controller 450 is provided with a plurality of configurations which can be operated together, sequentially, or in a programmed order. In some embodiments, the controller 450 has a first configuration to form a SAM layer on the substrate. In some embodiments, the controller 450 has a second configuration to deposit a film on the substrate. In some embodiments, the controller 450 has a third configuration to remove an amount of the film from the substrate using a cryogenic gas stream. The configurations of the controller 450 can include instruction sets for implementing the process parameters of the components and reactive gases described herein.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure includes modifications and variations that are within the scope of the appended claims and their equivalents.

What is claimed is:

1. A method comprising:
   exposing a substrate comprising a first surface and a second surface to a self-assembled monolayer (SAM) precursor to selectively form a SAM layer on the first surface over the second surface, the SAM layer containing defects that expose portions of the first surface;
   depositing a film by atomic layer deposition (ALD) on the second surface and exposed portions of the first surface, the film having a first average thickness on the first surface and a second average thickness on the second surface, the first average thickness being less than the second average thickness; and
   exposing the substrate to a cryogenic gas stream comprising an aerosol having particles of cryogenic gas clusters to remove an amount of the film from the first surface, the particles having a root mean square velocity greater than or equal to about Mach 2.

2. The method of claim 1, wherein the first surface is on a dielectric material and the second surface is on a conductive material.

3. The method of claim 2, wherein the dielectric material comprises one or more of silicon oxide, silicon nitride or silicon carbide.

4. The method of claim 2, wherein the conductive material comprises one or more of ruthenium, copper or cobalt.

5. The method of claim 1, wherein the film comprises a metal oxide.

6. The method of claim 1, wherein the cryogenic gas stream comprises one or more of $CO_2$, $N_2$, Ar or Ne.

7. The method of claim 1, wherein the root mean square velocity is in a range of about 800 m/s to about 1750 m/s.

8. The method of claim 1, wherein the SAM layer is substantially unaffected by the cryogenic gas stream.

9. The method of claim 1, wherein the cryogenic gas stream removes substantially all of the film from the first surface.

10. The method of claim 1, further comprising repeating depositing the film and exposing the substrate to the cryogenic gas stream to form a film with a predetermined thickness on the second surface.

11. A method comprising:
    exposing a substrate on a susceptor to a flow of a SAM precursor through a gas distribution assembly positioned so that a front face of the gas distribution assembly faces a top surface of the susceptor, the front face of the gas distribution assembly and the top surface of the susceptor defining a process volume, the substrate comprising a first surface and a second surface, the SAM precursor selectively forming a SAM layer on the first surface over the second surface, the SAM layer containing defects that expose portions of the first surface;

depositing a film by atomic layer deposition (ALD) on the second surface and exposed portions of the first surface by providing a flow of one or more deposition gases through the gas distribution assembly, the film having a first average thickness on the first surface and a second average thickness on the second surface, the first average thickness being less than the second average thickness; and removing an amount of the film from the exposed portions of the first surface by providing a cryogenic gas stream with a spray pattern and a spray area from a high-speed cryogenic gas nozzle into the process volume, the cryogenic gas stream having a root mean square velocity greater than or equal to about Mach 2.

* * * * *